(12) United States Patent
Orlowski

(10) Patent No.: US 7,954,332 B2
(45) Date of Patent: Jun. 7, 2011

(54) TEMPERATURE CONTROL SYSTEMS AND METHODS

(75) Inventor: Tomasz M. Orlowski, Somerville, NJ (US)

(73) Assignee: Alkhorayef Petroleum Company, Alkhobar (SA)

( * ) Notice: Subject to any disclaimer, the term of this patent is extended or adjusted under 35 U.S.C. 154(b) by 432 days.

(21) Appl. No.: 11/624,843

(22) Filed: Jan. 19, 2007

(65) Prior Publication Data

US 2008/0173024 A1    Jul. 24, 2008

(51) Int. Cl.
    *F25B 21/02* (2006.01)
(52) U.S. Cl. ........... 62/3.7; 62/3.2; 62/3.3; 165/104.33; 165/122; 174/16.1; 174/16.3; 361/689; 361/704; 361/709; 700/299; 700/300
(58) Field of Classification Search ............ 62/3.7, 62/3.2, 3.3, 259.2
    See application file for complete search history.

(56) References Cited

U.S. PATENT DOCUMENTS

| | | | | |
|---|---|---|---|---|
| 2,416,152 A | 2/1947 | Braun | ........................... | 257/658 |
| 2,713,655 A | 7/1955 | Grubman | ...................... | 257/658 |
| 3,040,538 A | 6/1962 | Alsing | ............................. | 62/3.2 |
| 3,087,309 A | 4/1963 | Toulmin, Jr. | ..................... | 62/3.2 |
| 3,226,602 A | 12/1965 | Elfving | ......................... | 361/700 |
| 3,626,704 A | 12/1971 | Coe, Jr. | ......................... | 430/131 |
| 3,732,919 A | 5/1973 | Wilson | .......................... | 165/110 |
| 4,290,273 A | 9/1981 | Meckler | .......................... | 62/148 |
| 4,301,658 A | 11/1981 | Reed | ............................... | 62/3.3 |
| 4,306,613 A * | 12/1981 | Christopher | .................. | 165/276 |
| 4,328,677 A | 5/1982 | Meckler | .......................... | 62/124 |
| 4,347,474 A | 8/1982 | Brooks et al. | ................. | 323/224 |
| 4,449,576 A | 5/1984 | Baum et al. | ............... | 165/104.33 |
| 4,463,569 A | 8/1984 | McLarty | .......................... | 62/3.2 |
| 4,478,277 A | 10/1984 | Friedman et al. | ............. | 165/185 |
| 4,490,982 A | 1/1985 | Christmas | ........................ | 62/3.2 |
| 4,631,728 A | 12/1986 | Simons | ........................... | 372/34 |
| 4,685,081 A | 8/1987 | Richman | .......................... | 365/1 |
| 4,709,323 A | 11/1987 | Lien | ................................ | 363/97 |
| 5,035,052 A | 7/1991 | Suzuki et al. | ............ | 29/890.046 |
| 5,079,618 A | 1/1992 | Farnworth | .................... | 257/713 |
| 5,097,829 A | 3/1992 | Quisenberry | ................ | 607/105 |
| 5,128,517 A | 7/1992 | Bailey et al. | .................. | 219/506 |
| 5,172,689 A | 12/1992 | Wright | .......................... | 607/104 |

(Continued)

FOREIGN PATENT DOCUMENTS

DE    37 30 830 A    3/1989

(Continued)

OTHER PUBLICATIONS http://www.ab.com/drives/energy_savings/Application%20Profiles-Whitepapers/ElecSubPump.pdf Variable Frequency Drives Optimize Performance and Protection of Offshore Oil Electric Submersible Pumps: Application Notes, Allen-Bradley, Rockewell Automation (www.rockwellautomation.com), 2001.*

(Continued)

*Primary Examiner* — Cheryl J Tyler
*Assistant Examiner* — Justin Loffredo
(74) *Attorney, Agent, or Firm* — Winston & Strawn LLP

(57) ABSTRACT

Systems and methods for controlling the temperature of an electrical device is described. The system includes a heat sink system in conjunction with a thermoelectric assembly. The systems and methods are particularly suitable in NEMA-4 electrical enclosures used in electrical submersible pump applications.

20 Claims, 2 Drawing Sheets

U.S. PATENT DOCUMENTS

| | | | |
|---|---|---|---|
| 5,174,121 A | 12/1992 | Miller | 62/3.7 |
| 5,190,032 A | 3/1993 | Zacoi | 607/104 |
| 5,197,291 A | 3/1993 | Levinson | 62/3.2 |
| 5,197,294 A | 3/1993 | Galvan et al. | 62/3.62 |
| 5,279,128 A | 1/1994 | Tomatsu et al. | 62/3.4 |
| 5,315,830 A | 5/1994 | Doke et al. | 62/3.2 |
| 5,371,665 A | 12/1994 | Quisenberry et al. | 363/89 |
| 5,450,727 A | 9/1995 | Ramirez et al. | 62/3.7 |
| 5,505,046 A | 4/1996 | Nelson et al. | 62/3.6 |
| 5,528,485 A | 6/1996 | Devilbiss et al. | 363/89 |
| 5,561,981 A | 10/1996 | Quisenberry et al. | 62/3.7 |
| 5,566,062 A | 10/1996 | Quisenberry et al. | 363/89 |
| 5,588,300 A | 12/1996 | Larsson et al. | 62/3.61 |
| 5,648,716 A | 7/1997 | Devilbiss et al. | 363/89 |
| 5,655,375 A | 8/1997 | Ju | 62/3.6 |
| 5,890,371 A * | 4/1999 | Rajasubramanian et al. | 62/259.2 |
| 5,934,079 A * | 8/1999 | Han et al. | 62/3.2 |
| 6,058,712 A | 5/2000 | Rajasubramanian et al. | 62/3.6 |
| 2005/0016715 A1 * | 1/2005 | Werner et al. | 165/104.33 |
| 2006/0117761 A1 * | 6/2006 | Bormann | 62/3.6 |
| 2006/0130652 A1 * | 6/2006 | Takewaki et al. | 95/148 |
| 2006/0175064 A1 | 8/2006 | Yuratich | 166/381 |
| 2008/0083450 A1 * | 4/2008 | Benoit et al. | 136/246 |

FOREIGN PATENT DOCUMENTS

| | | |
|---|---|---|
| DE | 40 36 210 | 5/1992 |
| DE | 93 12 138 U1 | 10/1993 |
| EP | 0 478 204 | 4/1992 |
| GB | 2 260 191 | 4/1993 |
| JP | 57-138415 A | 8/1982 |
| JP | 57-188855 | 11/1982 |
| JP | 7-106640 | 4/1995 |
| JP | 8-136422 A | 5/1996 |

OTHER PUBLICATIONS

International Search Report and Written Opinion of the International Searching Authority, application No. PCT/US2008/051300, dated Sep. 18, 2008.

* cited by examiner

TEMPERATURE CONTROL SYSTEMS AND METHODS

TECHNICAL FIELD OF THE INVENTION

The invention relates to a system for controlling the temperature of an electrical device, and more particularly to such a system that uses passive and active heat transfer.

BACKGROUND OF THE INVENTION

Heat producing equipment such as, for example, electronic power inverters and converters are frequently subjected to very high ambient temperatures which may have an adverse affect on the life, reliability and/or performance of the equipment. Several systems are available for the cooling or conditioning of the air in the electronic enclosures. The technology used for cooling relate to and include passive cooling systems, conventional compressor-based systems and thermoelectric systems.

In passive cooling systems, the air to be cooled is circulated over an air-to-air heat exchanger, which includes folded, finned heat exchangers, heat pipes, etc. The heat is then exchanged with the outside ambient air. As the amount of heat to be removed from the enclosure increases, the size of the air-to-air heat exchanger must be increased in size. Another drawback of the passive cooling system is that the amount of heat the system can remove from the enclosure is determined by the ambient temperatures of the air surrounding the enclosure. Therefore, if the ambient temperature is at, for example, 55° C., the temperature inside the enclosure can only be lowered to a temperature slightly above the ambient temperature by the passive cooling system.

Compressor based systems function by using a refrigerant and the cooling function is achieved by the compression and expansion of the refrigerant. The compressor based systems are efficient but are bulky, have large maintenance costs and consume large amounts of electricity. Also, all the cooling is done actively, which may not be necessary when, for example, the ambient outside air is sufficiently cool.

Thermoelectric temperature control systems use thermoelectric devices that pump heat using the Peltier effect. The thermoelectric devices are highly reliable and very economical at low wattage applications. As the number of watts to be removed are increased, the cost of this type of system increases as the cost is directly related to the number of thermoelectric devices that are needed for the particular function. The cooling capacity may be limited because of the power supply requirements since more thermoelectric devices necessitates more power.

The most typical thermoelectric device incorporates a thermoelectric module/component that utilizes electrical current to absorb heat from one side of the module and dissipate that heat on the opposite side. If the current direction is reversed, so is the heat pumping. Generally, cold sides and hot sides are developed necessitating an effective means of removing or adding heat from or to a solid, liquid or a gas (typically air).

U.S. Pat. No. 5,890,371 describes a hybrid air conditioning system that includes a passive heat removal system in conjunction with a thermoelectric temperature control system for conditioning the air in an enclosure. The passive heat removal system pre-cools warm or heated air. The pre-cooled air then flows through and over the thermoelectric temperature control system. The passive heat removal system includes a heat pipe or phase change type of heat exchanger that includes a passive evaporator connected by a pipe to a passive condenser. The heat pipe or heat pipe system is preferably a vacuum-type vessel that is evacuated and partially filled with an operational amount of working fluid, which evaporates at a low temperature. As heat is directed into a portion of the evaporator, the working fluid is vaporized creating a pressure gradient in the heat pipe system. This pressure gradient forces the vapor to flow along the pipe to the cooler section (the condenser) where it condenses, giving up its latent heat of vaporization. The working fluid is then returned to the evaporator by capillary forces developed in the heat pipe's porous wick structure, or by gravity.

It would be advantageous to provide a system that can control the temperature of the air in electronic enclosures in an improved manner, which would enable lower cost, increased reliability and efficiency, and low maintenance.

SUMMARY OF THE INVENTION

The present invention relates to a system for controlling the temperature of an electrical device. The system includes a heat sink system in thermal association with heat producing equipment to passively dissipate heat from the device, a thermoelectric assembly in thermal association with the heat producing equipment to actively transfer heat to or from the device, a power control system operatively connected to the thermoelectric assembly for activating the thermoelectric assembly to obtain a predetermined temperature of the device, and a sensor operatively connected to the power control system to provide an input to the power control system indicative of the temperature of the device and for sensing the temperature of the device.

In a preferred embodiment, the electrical device includes an electrical submersible pump variable speed drive system. Typically, the electrical device includes both the heat producing equipment and a housing. In such a case, either the heat sink system or thermoelectric assembly may be associated with the housing.

In one embodiment, the housing is closed and filled with a fluid medium, such as air. In this embodiment, the system may also include an air circulation device, such as a fan, configured for circulating the air within the housing. The air circulation device is preferably activated by the power control system to control the level of heat transfer through the thermoelectric assembly.

The heat sink system is preferably in contact with the heat producing equipment to more effectively cool the elements of the equipment. The heat sink system generally does not include a condenser or evaporator component since it does not require a liquid to function.

The heat producing equipment typically produces between about 2 to 10 kW of heat. In one embodiment, the heat sink system is configured to dissipate between about 50 to about 90 percent of heat in the device at a rate of about 2 to about 20 kBtu/hour. In another embodiment, the thermoelectric assembly is configured to transfer between about 10 to about 60 percent of heat to or from the device at a rate of about 2 to about 10 kBtu/hour.

The inventive system preferably also includes a polarity reversal circuit operatively connected between the power control system and the thermoelectric assembly to reverse the heat transfer with respect to the device. This feature is useful during cold temperatures to avoid water condensation within the housing.

The present invention further relates to a system for controlling the temperature of an electrical submersible pump variable speed drive system. The present system includes a housing associated with heat producing equipment, a heat sink system in thermal association with the heat producing equipment to passively dissipate heat from the variable speed drive system, a thermoelectric assembly in thermal association with the heat producing equipment to actively transfer heat to or from the variable speed drive system, a power control system operatively connected to the thermoelectric assembly for activating the thermoelectric assembly to obtain a predetermined temperature of the variable speed drive system, and a sensor operatively connected to the power control system to provide an input to the power control system indicative of the temperature of the variable speed drive system and for sensing the temperature of the variable speed drive system.

In one embodiment, the thermoelectric assembly is configured to transfer heat from the variable speed drive system at a rate of about 2 to about 10 kBtu/hour. In this same embodiment, the thermoelectric assembly may also be configured to transfer heat to the variable speed drive system.

In another embodiment, the heat sink system is configured to dissipate heat at a rate of about 2 to about 20 kBtu/hour.

Furthermore, the present invention relates to a method of controlling the temperature of an electrical device. The method includes determining the temperature of the air surrounding the electrical device, passively dissipating heat produced by the electrical device through a heat sink system in thermal association with heat producing equipment, and actively transferring heat to or from the electrical device through a thermoelectric assembly in thermal association with the heat producing equipment.

The electrical device generally includes both the heat producing equipment and a housing. Preferably, the electrical device comprises an electrical submersible pump variable speed drive system. In one embodiment, the method also includes reversing heat transfer through the thermoelectric assembly to provide heat to the electrical device.

DETAILED DESCRIPTION OF THE PREFERRED EMBODIMENTS

Figure 1:
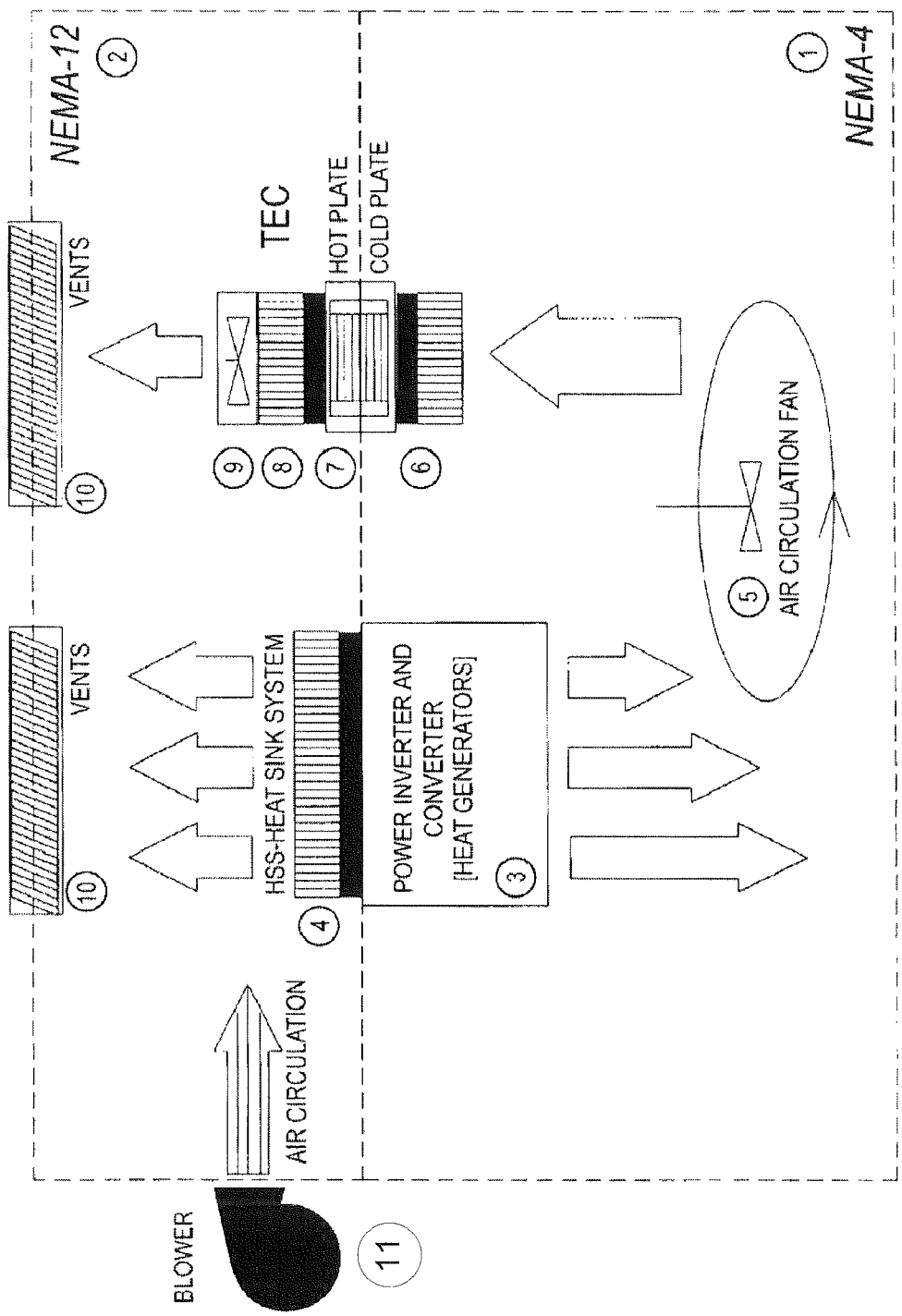
FIG. 1 is a block diagram showing the air and heat flow a preferred embodiment of a system according to the invention.

The present invention relates to temperature control systems, and more particularly to a heat sink system in conjunction with a thermoelectric assembly for controlling the temperature of an electrical device. In a preferred embodiment, the electrical device includes a variable speed drive (VSD) enclosure for electrical submersible pump (ESP) applications, which shelters heat producing equipment such as a electronic power converters, inverters, chokes, filters, or other electronic and power equipment in water-tight NEMA-4 enclosures. The present methods of combined cooling assure acceptable internal temperatures for electronic devices to work in very high ambient temperatures and air-tight enclosures.

The heat sink system pre-cools elements of the heat producing equipment, e.g., power inverters and converters, while the thermoelectric assembly controls the temperature of the air in the housing that contains the heat producing equipment. The thermoelectric assembly aids in the obtainment of a functional, predetermined temperature of the device. This combination makes it possible to enclose power elements inside NEMA-4 water-tight enclosures even at extreme ambient temperatures. The present system may be used specifically in VSD systems since it complies with industry specific standards and requirements.

VSD systems are used in the oil, gas, and petrochemical industry to control pumps and compressors. Often, work in these industries takes place in arctic, desert or tropical conditions. In fact, oil production frequently occurs in the desert. The ambient temperature in the desert is typically about 55° C., and the internal electronic parts of the VSD system usually function at about 40° C. It is not possible to run oil production equipment without cooling the ESP VSD systems. If the internal temperature of the air inside the housing or enclosure rises above 40° C., control of the VSD system will be lost. The VSD system automatically shuts down or is faulted. The massive heat generated inside the enclosure has to be dissipated. The present system is particularly advantageous for use in ESP VSD systems because it is a non-refrigerant/non-compressor system, and because the heat sink system and thermoelectric assembly are separated.

VSD systems used in ESP applications typically provide power in the range of about 250 to about 350 kVA. The VSD systems also usually provide current in the range of about 300 to about 450 A, and require about 400 to about 500 V to operate. In an exemplary embodiment, the VSD system provides 315 kVA of power and 410 A of current.

The heat generated by VSD systems is typically between about 1 kW to about 10 kW. In one embodiment, the heat sink system is configured to remove about 50 to about 90 percent of the heat, preferably about 55 to about 80 percent, and more preferably about 60 to about 75 percent. The heat sink system generally dissipates heat at a rate of about 2 to about 20 kBtu/hour, preferably about 5 to about 15 kBtu/hour, and more preferably about 7 to about 10 kBtu/hour. For example, in one embodiment, the heat generated by the VSD system is about 4 kW, and the heat sink system dissipates about 3 kW of the heat at a rate of about 10 kBtu per hour.

The heat sink system passively dissipates heat and thus does not require electrical energy to operate. A heat sink usually consists of a base with one or more flat surfaces and an array of comb or fin-like protrusions increase the heat sink's surface area contacting the air, and thus increasing the heat dissipation rate. While a heat sink is a static object, a fan or blower often aids a heat sink by providing increased airflow over the heat sink—thus maintaining a larger temperature gradient by replacing the warmed air more quickly than passive convection achieves alone. Heat sinks are made from a good thermal conductor such as copper or aluminum alloy. The structure and dimensions of the heat sink are readily determined by one of ordinary skill in the art, based on how the heat sink is to be used, e.g., the amount of heat to be dissipated, or the temperature difference between the heat producing equipment and ambient air.

In addition, the heat sink system preferably does not include a compressor, refrigerant, condenser, and/or evaporator-type component. The heat sink system does not require a liquid or coolant to operate.

Thermoelectric assemblies are well known in the art. The typical thermoelectric device is manufactured using two thin ceramic wafers with a series of P and N doped bismuth-telluride semiconductor material sandwiched between them. When the appropriate power from a power control system, battery or other DC source is applied, heat is moved from one side of the device to the other, where it is typically removed with a heat sink, such as slab of metal to create a hot plate. In most applications, a heat sink alone will not be able to remove a sufficient amount of heat by natural convection to keep the hot side at an acceptably low temperature. To help the heat sink remove heat, a fan or blower is typically attached which forces ambient temperature air over the heat sink and exhausts the heat to ambient.

The cold side of the thermoelectric device is commonly used to cool an object, such as an electronic device. The object cooled can be a block of metal creating a cold plate, another forced convection heat sink making an air-to-air exchanger, a liquid heat sink forming a liquid-to-air exchanger, a probe for a water cooler or just about anything else with a flat surface. If the current is reversed the thermoelectric device makes an excellent heater. This allows thermoelectric devices to be used for heating, cooling and temperature stabilization.

In a preferred embodiment, thermoelectric assembly is configured to transfer between about 10 to about 60 percent, preferably about 20 to about 50 percent, and more preferably about 30 to about 40 percent, of heat to or from the electrical device. The thermoelectric assembly generally transfers heat at a rate of about 2 to about 10 kBtu/hour, preferably about 3 to about 8 kBtu/hour, and more preferably about 4 to about 6 kBtu/hour. In an exemplary embodiment, the thermoelectric assembly is configured to transfer heat at a rate of about 4.1 kBtu/hour in a device that generates about 4 kW of heat.

The thermoelectric assembly generally includes a 0.5 kW to 5 kW capacity thermoelectric device. In a preferred embodiment, a 1.2 kW capacity thermoelectric device is used. The power supplied to the thermoelectric assembly to reach the desired level of heat transfer is typically about 800 W at about 24 V of DC current.

Referring now to the Figures, FIG. 1 illustrates the air and heat flow inside housing 1 and enclosure 2. In a preferred embodiment, housing 1 is a NEMA-4 enclosure, and enclosure 2 is a NEMA-12 enclosure. Heat generated by the heat producing equipment 3, located in housing 1 and powered by the power control system (not shown), is divided into two streams. The main heat stream generated by the equipment 3, i.e., the power elements inside the converters and inverters, is focused directly into heat sink system 4. This heat is quickly and efficiently dissipated through heat sink system 4. Heat sink system 4 is installed to be in contact with equipment 3, outside housing 1, and is cooled with blowers 11.

The smaller part of the residual heat generated by heat producing equipment 3 is distributed inside housing 1 with the help of air circulation device 5, e.g., a fan, and transferred out of housing 1 through the thermoelectric assembly to obtain a desired, predetermined temperature. The thermoelectric assembly includes thermoelectric device 7 operatively connected to thermoelectric cold side radiator 6 and thermoelectric hot side radiator 8. Hot side radiator auxiliary fan 9 functions to cool hot side radiator 8. Vents 10 aid in the transfer of heat out of enclosure 2.

Figure 2:
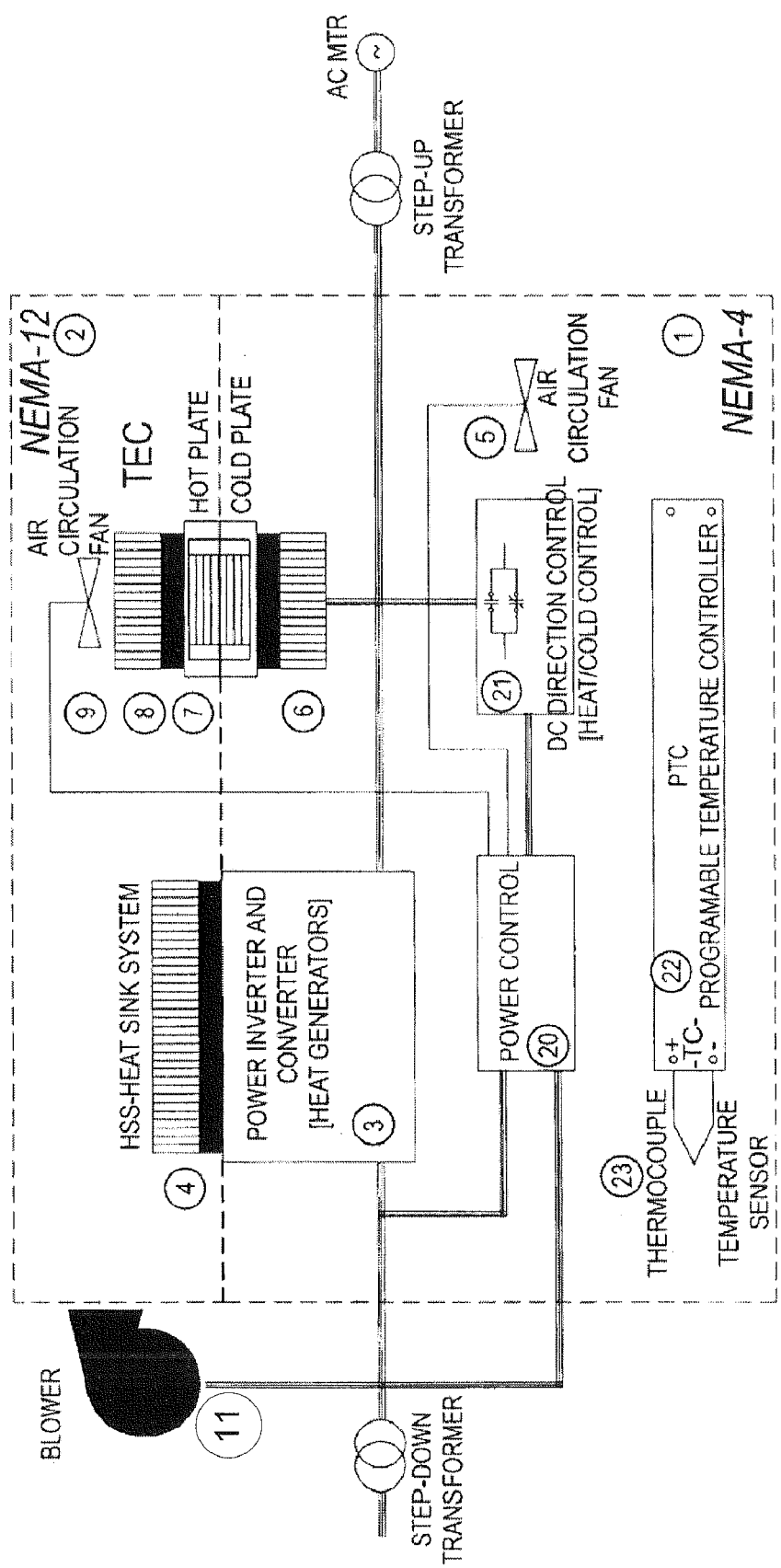
FIG. 2 is a block diagram showing the electrical and control diagram of a preferred embodiment of a system according to the invention.

Referring now to FIG. 2, heat is generated by heat producing equipment 3 supplied by the step-down transformer and that control the speed of the ESP motor and the step-up transformer. Power control system 20 receives an input from temperature sensor 23 located in housing 1, which is indicative of the temperature of the air in housing 1. Programmable temperature controller 22 measures the temperature inside housing 1 with temperature sensor 23 and commands power control system 20 to supply DC current to the thermoelectric assembly when the air inside housing 1 has reached a preset value.

Power control system 20 controls and supplies power to blowers 11, air circulation devices 5 and 9, and all other electronic equipment. If the signal from temperature sensor 23 indicates that the temperature of the air within housing 1 has reached a second preset value, power control system 20 activates air circulation device 5, air circulation device 9, and/or blowers 11. Air circulation devices 5 and 9 force circulation of the air inside housing 1. Air circulation device 5 provides movement of the air in housing 1, through a section of the thermoelectric assembly. Blowers 11 help heat dissipation of heat sink system 4, while air circulation device 9 provides movement of air away from the thermoelectric assembly.

Polarity reversal circuit 21 provides a hot or cold option for the system. Polarity reversal circuit 21 reverses the polarity of the DC voltage applied to the thermoelectric assembly to provide heating instead of cooling. The position or state of the polarity reversal circuit 21 is determined and controlled by the signal sent from power control system 20. If the air in housing 1 becomes colder than a preset value as indicated by the signal from temperature sensor 23 to power control system 20, power control system 20 will activate polarity reversal circuit 21. This application of a polarity reversed voltage to thermoelectric device 7 will result in the heating of thermoelectric cold side radiator 6, which results in the air in housing 1 being heated. The whole system works in closed-loop control mode to stabilize the temperature on a desired level.

While particular embodiments of the present invention have been described, it will be appreciated by those skilled in the art that various modifications, alternatives, variations, etc., may be made without departing from the spirit and scope of the invention as defined in the appended claims.

The invention claimed is:

1. A system for controlling the temperature of heat producing equipment, comprising:
    a sealed housing for the heat-producing equipment, the heat-producing equipment comprising variable speed drive system equipment sized for submersible pump applications in the oil, gas, and petrochemical industries;
    a vented housing for receiving heat from within the sealed housing and configured for facilitating transfer of received heat to air within the vented housing and for transfer of the heated air to the exterior though one or more air vents in the walls of the vented housing;
    a heat sink system in physical contact with the heat producing equipment for passively and conductively transferring heat without liquids or coolants directly from the equipment into the air within the vented housing;
    a thermoelectric assembly in indirect thermal association with the heat producing equipment for actively transferring heat from air within the sealed housing into the vented housing;
    a power control system operatively connected to the thermoelectric assembly for activating the thermoelectric assembly to obtain a predetermined temperature; and
    a sensor operatively connected to the power control system to provide an input to the power control system indicative of the temperature within the sealed housing.

2. The system of claim 1 wherein the heat producing equipment comprises variable speed drive equipment sized for electrical submersible pump applications.

3. The system of claim 1 wherein the heat sink system or thermoelectric assembly is associated with the vented housing.

4. The system of claim 1 wherein the sealed housing comprises a fluid medium for establishing a thermal association between the heat-producing equipment and the thermoelectric assembly.

5. The system of claim 4 further comprising a circulation device configured for circulating the fluid medium.

6. The system of claim 5 wherein the circulation device is activated by the power control system when the sensor indicates that the temperature of the fluid in the sealed housing has reached a second preset value.

7. The system of claim 5 wherein the heat producing equipment produces between about 2 to 10 kW of heat.

8. The system of claim 1 further comprising a polarity reversal circuit operatively connected between the power control system and the thermoelectric assembly to reverse the direction of heat transfer between the sealed housing and the vented housing.

9. The system of claim 1 wherein the sealed housing and the vented housing are in conductive contact.

10. The system of claim 1 wherein the thermoelectric assembly is activated to transfer heat into the vented housing when the sensor indicates that the temperature within the sealed housing has reached a first preset value.

11. The system of claim 1 further comprising a blower for circulating air within the vented housing, the blower being activated when the sensor indicates that the temperature within the sealed housing has reached a first preset value.

12. A system for controlling the temperature of heat-producing variable speed drive system equipment sized for submersible pump applications in the oil, gas, and petrochemical industries, the system comprising:
   a sealed housing for the heat producing equipment, the heat producing equipment producing between about 2 to 10 kW of heat;
   a vented housing for receiving heat from within the sealed housing and configured for facilitating transfer of received heat to air within the vented housing and for transfer of the heated air to the exterior though one or more air vents in the walls of the vented housing;
   a heat sink system in physical contact with the heat producing variable speed drive system equipment for passively and conductively transferring heat without liquids or coolants directly from the variable speed drive system equipment into the air within the vented housing;
   a thermoelectric assembly in indirect thermal association with the heat producing variable speed drive system equipment for actively transferring heat from air within the sealed housing into the vented housing;
   a power control system operatively connected to the thermoelectric assembly for activating the thermoelectric assembly to obtain a predetermined temperature; and
   a sensor operatively connected to the power control system to provide an input to the power control system indicative of the temperature within the sealed housing.

13. The system of claim 12 wherein the thermoelectric assembly is configured to transfer heat from the variable speed drive system at a rate of about 0.586 to 2.930 kW (about 2 to about 10 kBtu/hour).

14. The system of claim 13 wherein the thermoelectric assembly is configured to transfer heat to the variable speed drive system.

15. The system of claim 12 wherein the heat sink system is configured to dissipate heat at a rate of about 0.586 to about 5.861 kW (about 2 to 20 kBtu/hour).

16. A method of controlling the temperature of an electrical submersible pump variable speed drive system for oil, gas, and petrochemical industry applications, which comprises:
   determining the temperature of the air in a sealed housing surrounding the electrical device;
   passively and conductively transferring heat produced by the electrical device into a vented housing through a heat sink system in physical contact with heat producing electrical device, the vented housing being separate from the sealed housing, the heat sink system being without liquids of coolants;
   actively transferring heat produced by the electrical device into the air within the vented housing from air within the sealed housing through a thermoelectric assembly in indirect thermal association with the heat producing electrical device in dependence on the determined temperature;
   heating air within the vented housing by the heat transferred into the vented housing; and
   transferring heated air within the vented housing to the exterior through one or more air vents in the walls of the vented housing.

17. The method of claim 16 further comprising reversing heat transfer through the thermoelectric assembly to provide heat to the electrical device.

18. The method of claim 16 further comprising activating the thermoelectric assembly to transfer heat into the vented housing only when a sensor indicates that the temperature within the sealed housing has reached a first preset value.

19. The method of claim 16 further comprising activating a blower for circulating air within the vented housing when a sensor indicates that the temperature within the sealed housing has reached a second preset value.

20. The method of claim 16, wherein the electrical submersible pump variable speed drive system produces between about 2 to 10 kW of heat.

* * * * *

UNITED STATES PATENT AND TRADEMARK OFFICE
CERTIFICATE OF CORRECTION

PATENT NO.        : 7,954,332 B2                                    Page 1 of 1
APPLICATION NO.   : 11/624843
DATED             : June 7, 2011
INVENTOR(S)       : Orlowski It is certified that error appears in the above-identified patent and that said Letters Patent is hereby corrected as shown below:

Column 8:
Line 4 (claim 13, line 4), after "2 to" delete "about"
Line 9 (claim 15, line 2), after "0.586 to" delete "about"

Signed and Sealed this
Nineteenth Day of July, 2011

David J. Kappos
*Director of the United States Patent and Trademark Office*